(12) United States Patent
Swihart

(10) Patent No.: US 6,737,204 B2
(45) Date of Patent: May 18, 2004

(54) HYBRID PROOFING METHOD

(75) Inventor: Donald L. Swihart, Stillwater, MN (US)

(73) Assignee: Kodak Polychrome Graphics, LLC, Norwalk, CT (US)

(*) Notice: Subject to any disclaimer, the term of this patent is extended or adjusted under 35 U.S.C. 154(b) by 0 days.

(21) Appl. No.: 10/238,508

(22) Filed: Sep. 4, 2002

(65) Prior Publication Data

US 2003/0068569 A1 Apr. 10, 2003

Related U.S. Application Data

(60) Provisional application No. 60/317,015, filed on Sep. 4, 2001.

(51) Int. Cl.[7] ............................ G03C 1/805; G03C 8/52
(52) U.S. Cl. ..................... 430/15; 430/201; 430/257; 430/293; 430/358
(58) Field of Search ................ 430/48, 200, 201, 430/257, 293, 358, 15, 97

(56) References Cited

U.S. PATENT DOCUMENTS

| 3,729,313 A | 4/1973 | Smith |
| 3,775,113 A | 11/1973 | Bonham et al. |
| 3,887,450 A | 6/1975 | Gilano et al. |
| 3,895,949 A | 7/1975 | Akamatsu et al. |
| 3,987,037 A | 10/1976 | Bonham et al. |
| 4,043,810 A | 8/1977 | Acuncius et al. |
| 4,058,400 A | 11/1977 | Crivello |
| 4,058,401 A | 11/1977 | Crivello |
| 4,228,232 A | 10/1980 | Rousseau |
| 4,304,923 A | 12/1981 | Rousseau |
| 4,876,235 A | 10/1989 | DeBoer |
| 4,885,225 A | 12/1989 | Heller et al. |
| 5,019,549 A | 5/1991 | Kellogg et al. |
| 5,126,760 A | 6/1992 | DeBoer |
| 5,156,938 A | 10/1992 | Foley et al. |
| 5,171,650 A | 12/1992 | Ellis et al. |
| 5,176,973 A | 1/1993 | Gifford et al. |
| 5,248,583 A | 9/1993 | Lundquist et al. |
| 5,298,361 A | 3/1994 | Bonham |
| 5,401,606 A | 3/1995 | Reardon et al. |
| 5,475,418 A | 12/1995 | Patel et al. |
| 5,484,919 A | 1/1996 | Bonham |
| 5,501,937 A | 3/1996 | Matsumoto et al. |
| 5,516,622 A | 5/1996 | Savini et al. |
| 5,518,861 A | 5/1996 | Coveleskie et al. |
| 5,532,115 A | 7/1996 | Bodager et al. |
| 5,534,387 A | 7/1996 | Bodager et al. |
| 5,580,693 A | 12/1996 | Nakajima et al. |
| 5,725,989 A | 3/1998 | Chang et al. |
| 5,776,651 A | 7/1998 | Lu et al. |
| 5,935,758 A | 8/1999 | Patel et al. |
| 6,165,654 A | * 12/2000 | Taylor et al. ............... 430/201 |
| 6,365,305 B1 | * 4/2002 | Taylor et al. ............... 430/15 |

FOREIGN PATENT DOCUMENTS

| EP | 0 382 420 B1 | 6/1996 |
| EP | 0 675 003 B1 | 9/1997 |

* cited by examiner

*Primary Examiner*—John L Goodrow
(74) *Attorney, Agent, or Firm*—Shumaker & Sieffert, PA

(57) ABSTRACT

The present invention provides a flexible and convenient method that combines a digital color image with the versatility of an analog imaging method to create a hybrid digital/analog image, wherein an analog image is formed directly on a digitally generated image.

22 Claims, 5 Drawing Sheets

HYBRID PROOFING METHOD

This application claims priority from U.S. Provisional Application Serial No. 60/317,015, filed Sep. 4, 2001, the entire content of which is incorporated herein by reference.

TECHNICAL FIELD

The invention relates to printing systems, and more particularly, to color printing systems.

BACKGROUND

Photosensitive elements, which can be used in image-reproduction processes, are well known in the graphics arts industry. Such elements are usually exposed to actinic radiation through an image-bearing transparency, such as a color separation transparency, to produce an image which is either a positive or negative with respect to the transparency used.

Photosensitive elements are widely used in off-press color proofing to simulate the images produced by printing. In a surprint proof, all of the colored images are superimposed, by, for example, multiple exposure, lamination, or transfer, onto a single support. Unlike an overlay proof, the colored images cannot be separated and viewed individually.

Various processes for producing copies of images involving photopolymerization and thermal transfer techniques are known. Generally, in these processes, a photopolymerizable layer coated on a suitable support is imagewise exposed to a photographic transparency. The surface of the exposed layer is then pressed into contact with the image receptive surface of a separate element, and at least one of the elements is heated to a temperature above the transfer temperature of the unexposed portions of the layer. The two elements are then separated, whereby the thermally transferable, unexposed, image areas of the composite, transfer to the image receptive element. If the element is not precolored, the tacky, unexposed image may now be selectively colored with a desired toner. All of these processes necessitate the use of specially treated final receptor sheets and are not applicable for obtaining a color proofing image on a paper stock. If the element is precolored, flexibility in the choice of colors is limited because preparation of the precolored elements in all the desired colors is not economically feasible. Toning provides greater color flexibility.

U.S. Pat. No. 5,534,387 discloses a process for forming a colored image, said process comprising, in order: applying at least one aqueous permeable colorant-containing composition to a photosensitive element comprising, in order, a carrier element having a release surface, said carrier element being resistant to aqueous liquid development, a first adhesive layer, an unpigmented, first photosensitive layer consisting essentially of an aqueous liquid developable photosensitive composition, wherein the aqueous permeable colorant-containing composition is in contact with the first photosensitive layer, wherein the aqueous permeable colorant-containing composition is applied the unpigmented photosensitive composition. After imagewise exposing to actinic radiation, the photosensitive element having applied thereon the permeable colorant-containing composition results in imagewise exposed and unexposed regions in the unpigmented, first photosensitive layer and the overlying permeable colorant-containing composition. The element is then developed thereby removing either the imagewise exposed or imagewise unexposed regions, to produce a first colored pattern. A transfer element having a release surface is then laminated to the element having the first colored pattern, wherein the release surface is adjacent to the first colored pattern. The carrier element is then removed, revealing the adhesive layer. This element is then laminated to the permanent substrate and the transfer element having a release surface is peeled off to leave a single color image on the permanent substrate. A process for forming a multicolor image is also disclosed. This process provides the color flexibility, but the time needed to prepare these proofs is longer than that required to form a laser induced thermal image. Further, because this is an analog process, it requires the use of separation transparencies that require repeating each time a color change is desired.

U.S. Pat. No. 6,165,654 (Taylor et al.) discloses a combination digital/analog color proofing method having the steps of: digitally forming a color thermal image on a receiver element comprising a receiver support and an image receiving layer; laminating the digitally formed image with a film comprising a support having a release surface and a thermoplastic polymer layer; removing the support thereby revealing the thermoplastic polymer layer, and leaving the digitally formed image encased between the image receiving layer and the thermoplastic polymer layer; and laminating an analog color image to the revealed thermoplastic polymer layer to create a color proof having at least two color images.

SUMMARY

The present invention relates to a hybrid method for forming a color image proof wherein an analog color image can be formed directly on a digital color image.

A need exists for combining the high resolution and speed afforded by laser induced processes with the color versatility afforded by analog systems. Further, there exists a need for a method/system for generating a digital color image utilizing more than just laser induced transfer systems in combination with the color versatility of analog systems. Additionally, there exists a need for a streamlined hybrid method for generating a combination digital/analog color image, wherein each of the digital color image and analog color image are not generated separately.

In accordance with the present invention, the invention is directed to a method for forming a hybrid digital/analog color image that includes generating a digital color image on a substrate, assembling an analog receiver material in intimate contact with the substrate bearing the digital color image, coating a photopolymerizable analog color material on the analog receiver material, imagewise exposing the photopolymerizable analog color material to radiation, and processing the exposed photopolymerizable analog color material to form a hybrid digital/analog image.

In another embodiment, the invention is directed to a method for forming a hybrid digital/analog color image comprising generating a digital color image on a substrate and assembling an analog receiver material in intimate contact with the substrate bearing the digital color image. The analog receiver material is coated with a photopolymerizable analog color material prior to assembly. The method also includes imagewise exposing the photopolymerizable analog color material to radiation and processing the exposed photopolymerizable analog color material to form a hybrid digital/analog image.

In the methods of the present invention, a digital color image can be generated by a technique selected from the group consisting of inkjet, thermography, electrophotography, electrography, laser induced transfer, and a combination thereof. Preferably, the laser induced transfer method comprises a transfer method selected from the group consisting of dye sublimation, ablation, melt transfer, and film transfer.

In one embodiment, the method of the present invention includes generating a digital color image by assembling a digital donor element comprising a colorant in intimate contact with a digital receiver element, exposing the assembly to radiation to transfer at least a portion of the colorant of the digital donor element to the digital receiver element, and separating the digital donor element from the digital receiver element, leaving a color image residing on the digital receiver element. The steps of assembling, exposing and separating form a cycle that can be repeated at least once, wherein a different donor element comprising a different colorant is used in each repetition of the cycle but the same digital receiver element is used in each repetition of the cycle.

According to the methods of the present invention, the methods may further include coupling the hybrid digital/analog image to a final receptor and removing a digital receiver element from the digitally generated color image to form a hybrid digital/analog color proof.

Also, the methods may further include, for example, assembling a second analog receiver material in intimate contact with the hybrid digital/analog image, coating a second photopolymerizable analog color material on the receiver element, and repeating the imagewise exposing and processing steps to generate a hybrid digital/analog color image having two different analog color images thereon.

The invention may offer many advantages. Analog techniques may advantageously offer a wide range of colors, and digital techniques may advantageously offer easy storage and manipulation of image data. The invention may further enhance registration of digital and analog images.

DETAILED DESCRIPTION

Figure 1:
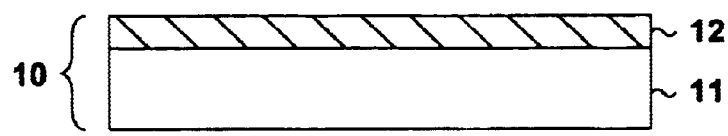
FIG. 1 illustrates a digital donor element (10), used in forming a digital image, having a donor substrate (11) on which is coated transfer material (12).

The present invention is directed to techniques for forming a color image proof comprising a digital image and an analog image. The techniques combine the respective advantages of digital and analog imaging. An advantage of analog techniques is that analog techniques can be used to print a wide variety of colors. Digital techniques include the advantages of easy storage and manipulation of image data. The invention combines the advantages of digital and analog imaging by forming one or more analog images directly on a digitally generated image.

In a method according to the present invention, a digital image may be formed by a variety of techniques so long as the imaging is formed in accordance with digitally stored image information. Suitable techniques include, but are not limited to, inkjet systems, thermographic systems, electrophotographic systems, electrographic systems, and laser induced systems. Any system is suitable for use in the method of the present invention so long as the materials of the analog system are compatible with the digitally created image. For example, the materials of the analog system should adhere to the digital image and should not interfere with the quality of the digital image.

As mentioned above, inkjet systems may be used in the method of the present invention and are roughly categorized into a continuous jet system and an on-demand system (impulse system). A first conventional example is such that dots are printed after they are converted into a specified matrix size for conducting medium tone recording (dither method). A second conventional example includes a plurality of ink chambers accommodating inks having different densities, a plurality of nozzles for each of the ink chambers and a plurality of dot forming sections corresponding to at least two inks of the same color having different densities. In the latter printer, gray scale level of a pixel formed as a matrix is generated by changing the number of ink particles supplied into the matrix and the density of the ink particles in accordance with a gray scale signal. A third example is such that the size of ejected ink droplets is changed by modifying conditions of a driving pulse of a piezoelectric device.

The line type inkjet recording apparatus records an image by using a recording head having a length corresponding to the entire length of a main scanning area. That is, the recording head is provided with a plurality of nozzles arranged in an extending direction of the recording head which corresponds to a main scanning direction so that the nozzles cover the entire width of a recording medium such as a recording paper on which an image is formed. According to the line type inkjet recording apparatus, an image is recorded on the recording medium by projecting ink drops onto the recording medium by moving the recording medium in a direction perpendicular to the extending direction of the recording head.

The serial scanning type inkjet recording apparatus records an image by using a recording head having a plurality of nozzles arranged in a sub-scanning direction. An image is recorded on a recording medium such as a recording paper by projecting ink drops onto the recording medium by moving the recording head in a main scanning direction while the recording medium is stepwisely moved in a sub-scanning direction.

In the above-mentioned inkjet recording apparatuses, recording density (dot density) is determined by a pitch of the nozzles provided on the recording head. Accordingly, in order to achieve a high-density recording, the pitch of the nozzles must be decreased. However, there is a limit in the pitch size due to difficulty in formation of the nozzles with a small pitch. Thus, there is a limit in increasing the recording density.

In thermographic systems, a film or paper base is coated with a thin film of solid ink that is then imagewise heated by a thermal head in contact with the ink coated base. Typically, the ink undergoes a physical change (e.g., it can melt or sublime) and transfers to a receiver to generate a color image on the receiver. A more detailed description of this technology can be found in *Imaging Processes and Materials*, Ch. 13, (Neblette's $8^{th\ Ed.}$) (1989).

A liquid electrographic imaging system includes an imaging substrate onto which a developer liquid is delivered to develop a latent image. The imaging substrate may be a permanent image receptor or, alternatively, a temporary image receptor, and may take the form of a drum, belt, or sheet. A liquid electrographic imaging system may be an electrostatic system having a dielectric material as the imaging substrate, or may take the form of an electrophotographic system having a photoreceptor as the imaging substrate. In an electrostatic system that makes use of a dielectric material, the latent image can be formed by selectively charging the dielectric substrate with an electrostatic stylus. In an electrophotographic system, the photoreceptor includes a photoconductive material that is uniformly charged, for example, with a corona charging device. A latent image can be formed on the photoreceptor by selectively discharging the photoreceptor with a pattern of electromagnetic radiation.

A multi-color imaging system may include several imaging stations that form a plurality of latent images on the imaging substrate. Each of the latent images in a multi-color imaging system is representative of one of a plurality of color separation images for an original multi-color image to be reproduced. As a latent image is formed, a development station applies developer liquid to the imaging substrate to develop the latent image.

The developer liquid includes a carrier liquid and developer particles that may include charge director and a colorant, such as a dye or a pigment. In a multi-color imaging system, each of a plurality of development stations applies an appropriately colored developer liquid to the imaging substrate to form an intermediate representation of the corresponding color separation image. A drying station dries the developer liquid applied by the development station or stations, leaving a film of developer material. The transfer station then transfers the developer material from the imaging substrate to an output substrate, such as a sheet of paper, fabric, plastic, or film, to form a visible representation of the original image. In some electrostatic imaging systems, the imaging substrate may serve as the output substrate, such that transfer is not necessary.

In electrophotography, a photoreceptor in the form of a plate, belt, or drum having an electrically insulating photoconductive element on an electrically conductive substrate is imaged by first uniformly electrostatically charging the surface of the photoconductive layer, and then exposing the charged surface to a pattern of light. The light exposure selectively dissipates the charge in the illuminated areas, thereby forming a pattern of charged and uncharged areas. A liquid or solid toner is then deposited in either the charged or uncharged areas to create a toned image on the surface of the photoconductive layer. The resulting visible toner image can be transferred to a suitable receiving surface such as paper. The imaging process can be repeated many times.

Laser-induced transfer can involve either mass transfer of the binder, colorants, and infrared absorber, giving a bi-level image in which either zero or maximum density is transferred (depending on whether the applied energy exceeds a given threshold), or dye sublimation transfer, giving a continuous tone image (in which the density of the transferred image varies over a significant range with the energy absorbed), as described in DeBoer, U.S. Pat. No. 5,126,760. Laser-induced mass transfer has been characterized in the literature, in *Applied Optics*, 9, 2260–2265 (1970), for example, as occurring via two different modes. One mode involves a less energetic mode in which transfer occurs in a fluid state (i.e., by melt transfer or film transfer), and one mode involves a more energetic mode in which transfer occurs by an explosive force, as a result of generation and rapid expansion of gases at the substrate-coating interface (i.e., by ablation transfer). This distinction has also been recognized in U.S. Pat. Nos. 5,156,938 (Foley), 5,171,650 (Ellis), 5,516,622 (Savini), and 5,518,861 (Covalaskie), which refer to ablation transfer as a process distinct from melt transfer, and refer to its explosive nature, as opposed to U.S. Pat. Nos. 5,501,937 (Matsumoto), 5,401,606 (Reardon), 5,019,549 (Kellogg), and 5,580,693 (Nakajima), which refer to transfer of a colorant in a molten or semi-molten (softened) state, with no mention of explosive mechanisms.

In one embodiment, a digital image formation of the present invention is formed by transferring a colorant (e.g., dye or pigment) from a donor to a receptor, via mass transfer (referred to as "film transfer" herein), under the influence of energy from a laser, as further described in U.S. Pat. No. 5,935,758 (Patel et al.). In general, this system involves the mass transfer of a half tone digital image in the form of discrete dots of a film of binder, colorant, and additives from the donor to the receptor. The dots are formed from a molten or softened film, and have well-defined, generally continuous edges that are relatively sharp with respect to density or edge definition (i.e., not feathered). In other words, the dots are formed with relatively uniform thickness over their area. This is in contrast to discrete dots formed as a result of thermal or laser dye transfer of a molecular dye (which involves transfer of the colorant without binder, either by diffusion or sublimation) or as a result of laser ablation mass transfer of fragments of material (which involves at least partially decomposing and/or volatilizing the binder or other additives in or under the transfer material to generate propulsive forces to propel the colorant toward the receptor). Neither laser ablation mass transfer nor dye transfer produce well-defined dots with relatively uniform thickness. Such generally continuous and relatively sharp edges produced by the system of the present invention are important for producing controlled, reproducible dot gain (i.e., changes in half tone dot size), and therefore, controlled, reproducible colors. Also, the system of the present invention includes components, such as latent crosslinking agents and bleaching agents, that provide a more controllable dot size and more reproducible and accurate colors, as described in greater detail below.

By way of illustrating the method of the present invention, a hybrid proofing method including a mass transfer system will be described. According to this technique, the digital donor element of the present invention includes a donor substrate on which is coated, preferably in one layer, a transfer material containing a hydroxylic binder, a fluorocarbon additive, a bleachable infrared absorbing dye, a latent crosslinking agent (i.e., latent curing agent), and a dispersible material (e.g., pigment). The digital receptor element of the present invention typically includes a digital receiver substrate on which is coated a binder, a bleaching agent and optional additives to form a receiving layer. The digital receptor element preferably has a texturized surface having a controlled degree of roughness, comprising a plurality of protrusions projecting above the plane of the outer surface of the receptor. The texturized surface may be created by incorporating polymer beads, silica particles, etc., in the binder, forming a receiving layer.

During imaging of the digital system of the present invention, the image is transferred from a single colored layer of material coated on a donor to an intermediate receptor on which is coated a strippable layer of material. A reverse image is formed on the intermediate receptor by means of a laser-induced transfer of colored material from the donor to the intermediate receptor. The colored donor is placed in intimate contact with the final receptor and imagewise exposed to a laser. In the areas in which the laser beam strikes the donor, the single colored layer is transferred from the donor to the receptor. When the donor is subsequently removed, the imaged areas remain on the receptor and the non-imaged areas remain on the donor. Multi-colored images are formed by repeating this process with different colored donors in register with the intermediate receptor.

One preferred laser induced transfer digital donor element (i.e., donor) of the present invention typically includes a donor substrate on which is coated transfer material, which can be in one or more layers, preferably in one layer, containing a hydroxylic binder, a fluorocarbon additive, a bleachable infrared absorbing dye, a latent crosslinking agent (i.e., latent curing agent), and a dispersible material (e.g., pigment), all of which are described in detail below. Other components that are optional, although preferred, include a dispersant, and coating aids, such as a fluorocarbon surfactant.

Suitable substrates for the digital donor include, for example, plastic sheets and films, such as, polyethylene terephthalate, fluorene polyester polymers, polyethylene, polypropylene, acrylics, polyvinyl chloride and copolymers thereof, and hydrolyzed and non-hydrolyzed cellulose acetate. The substrate needs to be sufficiently transparent to the imaging radiation emitted by the laser or laser diode to effect thermal transfer of the corresponding image to a receptor sheet. A preferred substrate for the donor is a polyethylene terephthalate sheet. The requirements for suitable donor substrates are described in greater detail in U.S. Pat. No. 5,935,758 (Patel et al.) (Cols. 7–8).

The binder in the transfer material comprises a crosslinkable binder that is a hydroxylic resin (i.e., a resin having a plurality of hydroxy groups). Preferably, 100% of the binder is a hydroxylic resin. The hydroxy groups may be alcoholic groups or phenolic groups (or both), but alcoholic groups are preferred. Preferably, the hydroxylic binder is a polyvinyl butyral binder available under the trade designation BUTVAR B-76 from Monsanto, St. Louis, Mo. Although such polyvinyl butyral binders are not typically used in crosslinking reactions, in the system of the present invention it is believed that the BUTVAR B-76 polyvinyl butyral crosslinks with the latent crosslinking agent described below. The binder composition is described in greater detail in U.S. Pat. No. 5,935,758 (Patel et al.) (Cols. 8–9).

The total binder is present in an amount of about 25 wt-% to about 75 wt-% preferably in an amount of about 35 wt-% to about 65 wt-%, based on the dry coating weight of the transfer material. Preferably, the hydroxy-equivalent weight of the total binder is at least about 1000 grams/mole.

The transfer material also includes a fluorocarbon additive for enhancing transfer of a molten or softened film and production of half tone dots (i.e., pixels) having well-defined, generally continuous, and relatively sharp edges. Under the conditions currently used in preparing and imaging the system of the present invention, it is believed that the fluorocarbon additive serves to reduce the cohesive forces within the transfer material at the interface between the laser-exposed heated regions and the unexposed regions, and thereby promotes clean "shearing" of the layer in the direction perpendicular to its major surface. This provides improved integrity of the dots with sharper edges, as there is less tendency for "tearing" or other distortion as the transferred pixels separate from the rest of the donor layer. Thus, unlike dye transfer systems, in which just the colorant is transferred, and unlike ablation transfer systems, in which gases are typically formed that propel the colorant toward the receptor, the system of the present invention forms images by transfer of the binder, pigment, and other additives, in a molten or softened state as a result of a change in cohesive forces. The change in cohesive forces assists in limiting the domain of the transferred material, thus, providing more control of the dot size.

An effect of the propulsive forces in an ablative system, however they are formed, is a tendency for the colorant to "scatter," producing less well defined dots made of fragments. In contrast, the system of the present invention produces dots formed from and transferred as a molten or softened film of material (e.g., binder, pigment, and additives). It is believed that the fluorocarbon additive, along with the crosslinking agent (discussed in greater detail below), promotes controllable flow of the material from the transfer material in a molten or softened state. This mechanism is similar to what occurs in conventional thermally induced wax transfer systems; however, the molten or softened material of the transfer material in the system of the present invention does not uncontrollably wick across to the receptor and spread over the surface of the receptor. Rather, the system of the present invention involves a more controlled mechanism in which the material melts or softens and transfers. This controlled mechanism results in reduced dot gain and high resolution, relative to thermally induced wax transfer systems.

A wide variety of compounds may be used as the fluorocarbon additive, as further described in U.S. Pat. No. 5,935,758 (Patel et al.) (Cols. 9–10), provided they are substantially involatile under normal coating and drying conditions, and sufficiently miscible with the binder material. A preferred fluorocarbon additive is a sulfonamido compound $(C_8F_{17})SO_2NH(CH_2CH_3)$ (N-ethyl perfluorooctanesulfonamide). The fluorocarbon additive is typically used in an amount of about 1 weight percent to about 10 weight percent, based on the dry coating weight of the transfer material. Preferably, the weight ratio of fluorocarbon to dispersible material (e.g., pigment) is at least about 1:10, and more preferably at least about 1:5.

The infrared absorbing dye (also referred to as a "photothermal converting dye") used in the system of the present invention is a light-to-heat converter. It is a cationic dye capable of being bleached, as further described in U.S. Pat. No. 5,935,758 (Patel et al.) (Cols. 10–13). Suitable cationic dyes for use in the transfer material of the present invention are selected from the group of tetraarylpolymethine (TAPM) dyes, amine cation radical dyes, and mixtures thereof. Preferably, the dyes are the tetraarylpolymethine (TAPM) dyes. Dyes of these classes are typically found to be stable when formulated with the other ingredients (i.e., to be compatible with the binder resin and other components of the transfer material), and to absorb in the correct wavelength ranges for use with the commonly available laser sources. Furthermore, dyes of these classes are believed to react with the latent crosslinking agent, described below, when photoexcited by laser radiation. This reaction not only contributes to bleaching of the infrared absorbing dye, but also leads to crosslinking of the binder, as described in greater detail below. Yet another useful property shown by many of these dyes is the ability to undergo thermal bleaching by nucleophilic compounds and reducing agents that may be incorporated in the receptor layer, as is also described in greater detail below.

The bleachable infrared absorbing dye is preferably present in a sufficient quantity to provide a transmission optical density of at least about 0.5, more preferably, at least about 0.75, and most preferably, at least about 1.0, at the exposing wavelength. Typically, this is accomplished with about 3 wt-% to about 20 wt-% infrared dye, based on the dry coating weight of the transfer material.

The latent crosslinking agent (i.e., latent curing agent) is a compound having a nucleus of formula:

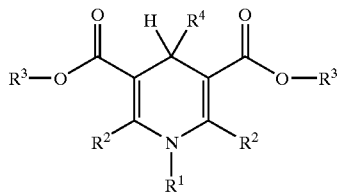

wherein: $R^1$ is H or an organic group, and each of $R^2$ and $R^3$ is an organic group, and $R^4$ is an aryl group. Each of $R^1$, $R^2$, and $R^3$ can be a polymeric group. That is, these can be a site by which compounds having the nucleus of formula form polymers, as long as the carbonyl groups are available for interaction with the hydroxylic binder. Preferably, $R^1$ is selected from the group of H, an alkyl group, a cycloalkyl group, and an aryl group (more preferably, $R^1$ is selected from the group of an alkyl group, a cycloalkyl group, and an aryl group); each $R^2$ and $R^3$ is independently an alkyl group or an aryl group; and $R^4$ is an aryl group. This latent crosslinking agent is preferably used in the transfer material in an amount of up to about 30 wt-%, based on the dry coating weight of the transfer material, although it can be used in the receptor element in addition to being used in the donor element. As used herein, a latent crosslinking agent is one that is typically only reactive in the system under conditions of laser address. This latent crosslinking agent is further described in U.S. Pat. No. 5,935,758 (Patel et al.) (Cols. 13–15).

The crosslinking agent is believed to be important for providing cohesion within the transferred pixel. This complements the action of the fluorocarbon additive, and results in transfer of the pixel as a coherent film, which enables dots of controlled size with sharp edges to be formed, leading to high quality images with reproducible colors. It is also believed to be important for preventing retransfer of pigment back to the donor, as well as back transfer of pigment to the donor in a subsequent imaging step.

The crosslinking effect during laser imaging results in a high quality transferred dot formed of a film with well-defined, generally continuous, and relatively sharp edges. It also prevents retransfer of colorant back to the donor, as well as back transfer of colorant to the donor in a subsequent imaging step. This greatly simplifies the imaging process, as well as yielding more controllable film transfer. These effects can be enhanced by subsequent heating to promote higher crosslink density.

Significantly, because the latent crosslinking agent can also act as a bleaching agent, it helps control the heat generated during imaging. That is, the latent crosslinking agent helps bleach out the infrared absorbing dye, thereby quenching the dye's absorption and moderating any tendency for runaway temperature rises, which could possibly cause ablation of the coating.

The dispersible material (also referred to as the "dispersed" material when dispersed within the transfer material) is a particulate material that is of sufficiently small particle size that it can be dispersed within the transfer material, with or without the aid of a dispersant. The dispersible material is further described in U.S. Pat. No. 5,935,758 (Patel et al.) (Cols. 15–17).

Suitable dispersible materials for use in the transfer material typically include colorants such as pigments and crystalline nonsublimable dyes. The pigment(s) or nonsublimable dye(s) in the transfer material are those typically used in the printing industry. They are generally insoluble in the transfer material coating composition and are nonsublimable under imaging conditions at atmospheric pressures. They should also be substantially unreactive with the bleaching agent under both ambient conditions and during the imaging process.

The pigment(s) or nonsublimable dye(s) are preferably present in the transfer material in an amount of about 10 wt-% to about 40 wt-%, based on the dry weight of the transfer material. Pigments are generally introduced into the transfer material composition in the form of a millbase comprising the pigment dispersed with a binder and suspended in a solvent or mixture of solvents. The binder is typically the same hydroxy-functional polymeric resin described above. A preferred resin is a polyvinyl acetal such as a polyvinyl butyral available under the trade designation BUTVAR B-76 from Monsanto, St. Louis, Mo.

Coating aids, dispersing agents, optical brighteners, UV absorbers, fillers, etc., can also be incorporated into the pigment mill base, or in the overall transfer material composition. Dispersing agents (i.e., dispersants) may be necessary to achieve optimum dispersion quality. A wide variety of surfactants may be used to improve solution stability. One preferred surfactant is a fluorocarbon surfactant used in the transfer material to improve coating quality. It is used in an amount of at least about 0.05 wt-%, preferably at least about 0.05 wt-% and no greater than about 5 wt-%, and typically in an amount of no greater than about 1–2 wt-%. The use of these optional additives is further described in U.S. Pat. No. 5,935,758 (Patel et al.) (Col. 17).

The transfer material of the digital donor element may be coated as a single layer, or as two or more contiguous layers, but a transfer medium comprising all the necessary components in a single layer is preferred. The relative proportions of the components of the transfer material may vary widely, depending on the particular choice of ingredients and the type of imaging required. Transfer material compositions for use in the invention are readily prepared by dissolving or dispersing the various components in a suitable solvent, typically an organic solvent, and coating the mixture on a substrate, as further described in U.S. Pat. No. 5,935,758 (Patel et al.) (Col. 17).

Pigmented transfer material compositions are most conveniently prepared by predispersing the pigment in the hydroxy-functional resin in roughly equal proportions by weight, in accordance with standard procedures used in the color proofing industry, thereby providing pigment "chips." Milling the chips with solvent provides a millbase, to which further resin, solvents, etc., are added as required to give the final coating formulation. Any of the standard coating methods may be employed, such as roller coating, knife coating, gravure coating, bar coating, etc., followed by drying at moderately elevated temperatures.

The relative proportions of the components of the transfer material may vary widely, depending on the particular choice of ingredients and the type of imaging required. Preferred pigmented media for use in the invention have the following approximate composition (in which all percentages are by weight):

| | |
|---|---|
| hydroxy-functional film-forming resin (e.g., BUTVAR B-76) | 35 to 65% |
| latent curing agent | up to 30% |
| infrared dye | 3 to 20% |
| pigment | 10 to 40% |
| pigment dispersant | 1 to 6% |

-continued

| | |
|---|---|
| (e.g., DISPERBYK 161) fluorochemical additive (e.g., a perfluoroalkylsulphonamide) | 1 to 10% |

Thin coatings (e.g., of less than about 3 $\mu$m dry thickness) of the transfer material composition may be transferred to a variety of receptor sheets by laser irradiation. Transfer occurs with high sensitivity and resolution, and heating the transferred image for relatively short periods (e.g., one minute or more) at temperatures in excess of about 120° C. causes curing and hardening, and hence an image of enhanced durability The receptor is chosen based on the particular application. Receptors may be transparent or opaque. Suitable receptors include coated paper, metals (i.e., steel and aluminum); films or plates composed of various film-forming synthetic or high polymers including addition polymers (e.g., poly(vinylidene chloride), poly(vinyl chloride), poly(vinyl acetate), polystyrene, polyisobutylene polymers and copolymers), and linear condensation polymers (e.g., poly(ethylene terephthalate), poly(hexamethylene adipate), and poly (hexamethylene adipamide/adipate)).

For the system of the present invention the receptor preferably comprises a support bearing a plurality of protrusions, providing a texturized surface, as further described in U.S. Pat. No. 5,935,758 (Patel) (Col. 18). For color imaging, the receptor is preferably paper (plain or coated) or a plastic film coated with a thermoplastic receiving layer. The receiving layer is typically several micrometers thick, and may comprise a thermoplastic resin capable of providing a tack-free surface at ambient temperatures, and which is compatible with the transferred material. When a receiving layer is present, it may advantageously contain a bleaching agent for the infrared dye, particulate materials, surfactants and antioxidants.

The donor, receptor, or both, may be textured with particulate material or otherwise engineered so as to present a surface having a controlled degree of roughness. That is, the donor, receptor or both of the present invention includes a support bearing a plurality of protrusions that project above the plane of the outer surface of the donor/receptor, respectively. The protrusions may be created by incorporating polymer beads, silica particles, etc., in a binder to form a receiving layer, as disclosed, for example, in U.S. Pat. No. 4,876,235. Microreplication may also be used to create the protrusions, as disclosed in EP Publication No. 0 382 420.

Although the use of particulate material in color proof systems is known, as disclosed in U.S. Pat. Nos. 4,885,225 (Heller), for example, it has been discovered that the protrusions on the receptor significantly enhance the film transfer mechanism of the process of the present invention and thereby the image quality. Without such protrusions in (or on) the receptor surface, there can be a tendency for dust artefacts and mottle to result in small areas (approximately 1 mm) of no image transfer.

The protrusions in the receptor regulate precisely the relationship between the donor and the receptor. That is, the protrusions are believed to provide channels for air that would otherwise be trapped between the donor and receptor to escape so there is uniform contact between the donor and the receptor over the entire area, which is otherwise impossible to achieve for large images. More importantly, the protrusions are believed to prevent entrapment of air in the transferred imaged areas. As the molten or softened film transfers to the receptor in a given area, the air can escape through the channels formed by the protrusions.

The protrusions provide a generally uniform gap between the donor and the receptor that is important for effective film transfer. The gap is not so large that ablative transfer occurs during imaging upon laser address. Preferably, the protrusions are formed from inert particulate material, such as polymeric beads. The optimum size and concentration of beads or other particles was found to depend on the dimensions of the footprint of exposing laser, i.e., the diameter of the illuminated spot at the plane of the colorant layer, which determines the minimum size of dot or pixel which can be transferred from donor to receptor. This is typically in the range of about 5 µm to about 50 µm, but may be different for different designs of imaging engine.

The beads or other particles may be of essentially uniform size (i.e., a monodisperse population), or may vary in size. Whichever type of population is used, the particles should not project above the plane of the surface of the receptor by more than about 8 µm on average, but should preferably project above said plane by at least about 1 µm, and more preferably at least about 3 µm. The composition of the polymeric beads is generally chosen such that substantially all of the visible wavelengths (400 nm to 700 nm) are transmitted through the material to provide optical transparency.

The shape, surface characteristics, concentration, size, and size distribution of the polymeric beads are selected to optimize the performance of the transfer process. The smoothness of the bead surface and shape of the bead may be chosen such that the amount of reflected visible wavelengths (400 nm to 700 nm) of light is kept to a minimum.

The optimum particle size depends on a number of factors, including the thickness of the receiving layer, the thickness of the transfer material (e.g., colorant layer) to be transferred, and the number of layers to be transferred to a given receptor. In the case of transfer of two or more layers to a single receptor, the projections provided by the particles must be great enough not to be obscured by the first layer(s) transferred thereto. The use and specification or the particulate materials are described in greater detail in U.S. Pat. No. 5,935,758 (Patel et al.) (Cols. 19–20).

In the system of the present invention, the crosslinking agent discussed above also acts as a bleaching agent and contributes to the removal of unwanted visible absorbance, so that a more accurate and predictable color may be achieved. However, the system of the present invention can additionally employ a separate thermal bleaching agent that is different from the crosslinking agent (e.g., a nucleophile such as an amine).

Suitable thermal bleaching agents (also referred to as "bleaching agents") do not require exposure to light to become active, but will bleach the relevant infrared dyes at ambient or elevated temperatures. The term "bleaching" means a substantial reduction in absorptions giving rise to color visible to the human eye, regardless of how this is achieved.

Suitable thermal bleaching agents include nucleophiles, such as an amine or a salt that decomposes thermally to release an amine, or a reducing agent, as described in EP Publication No. 0 675 003 (3M Company). Possible or preferred classes of bleaching agents are further described in U.S. Pat. No. 5,935,758 (Patel et al.) (Cols. 20–22).

Guanidines have good stability, solubility, and compatibility with the binders disclosed herein. They are solids as opposed to liquids, and are rapid acting. Solids are advantageous because they are involatile at room temperature. They are relatively small molecules which diffuse very effectively into the transferred material when heated. Significantly, they do not discolor during storage, do not precipitate out of water-based systems (e.g., latex systems) prior to coating onto a substrate, and do not crystallize out of the coating.

Whatever type of thermal bleaching agent is used, it is typically, and preferably, present prior to imaging in a receiving layer on the surface of the receptor element, although it is equally possible to deposit the thermal bleaching agent on the transferred image by appropriate means in an additional step subsequent to transfer of an image and separation of the donor and the receptor. Quantities of about 10 mole percent based on the compound of formula IV are effective. Generally, loadings of about 2 wt-% to about 25 wt-% of the bleaching agent in the receptor layer are suitable, normally about 5 wt-% to about 20 wt-%.

Preferably, the digital receptor consists of a polyethylene terephthalate sheet (75–150 micrometers thick) on which is coated a strippable layer consisting of an acrylic or a vinyl acetate adhesive. On this is coated a dispersion of a thermoplastic binder, a bleaching agent, and particulate material to form a receiving layer. Other additives may also be present, such as surfactants and antioxidants. The dispersion is typically coated out of water or an organic solvent. Suitable organic solvents include those listed above to coat the transfer material onto a substrate for preparation of the donor element, as well as others such as toluene, for example.

One preferred binder for use in the receiving layer is a polyvinyl pyrrolidone/vinyl acetate copolymer binder available under the trade designation E-735 from GAF, Manchester, UK. Another preferred binder is a styrene-butadiene copolymer available under the trade designation PLIOLITE S5C from Goodyear, Akron, Ohio. Yet another preferred binder is a phenoxy resin available under the trade designation PAPHEN PKHM-301 from Phenoxy Associates. A suitable receptor layer comprises PLIOLITE S5A containing diphenylguanidine as bleach agent (10 wt-% of total solids) and beads of poly(stearyl methacrylate) (8 µm diameter) (about 5 wt-% of total solids), coated at about 5.9 g/m$^2$.

Figure 2:
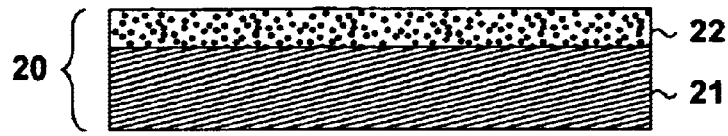
FIG. 2 illustrates a digital receptor element (20), used in forming a digital image, having a digital receiver substrate (21) on which is coated a receiving layer (22).
Figure 3:
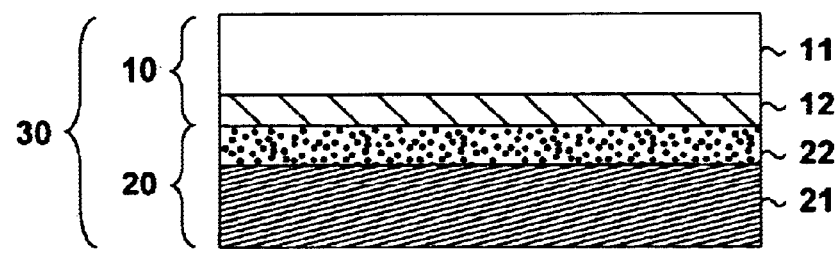
FIG. 3 illustrates the digital imaging element (30) having the coated transfer material (12) of the donor element (10) in intimate face-to-face contact with the receiving layer (22) of the receptor element (20), prior to the imagewise exposure to a laser.
Figure 4:
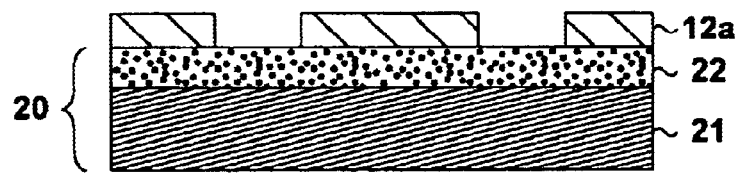
FIG. 4 illustrates the receptor element (20) having a digital halftone image (12a) on the receiving layer (22) of the receptor element, resulting from the imagewise exposure of the imaging element (30) to laser address and the separation of the donor element (10) and the receptor element (20).

As noted above, suitable techniques for forming a digital image include inkjet systems, thermographic systems, electrophotographic systems, electrographic systems, and laser induced systems. The substrate that bears the digital image may differ from one technique to another. The procedure for imagewise transfer of material from a digital donor 10, as shown in FIG. 1, to a digital receptor 20, as shown in FIG. 2, involves assembling the two elements in intimate face-to-face contact to form a digital imaging element 30, as shown in FIG. 3. Assembly may be performed by, e.g., vacuum hold down, or by means of the cylindrical lens apparatus described in U.S. Pat. No. 5,475,418 and scanned by a suitable laser. The assembly may be imaged by any of the commonly used lasers, depending on the absorber used, but address by near infrared emitting lasers, such as diode lasers and YAG lasers, is preferred. Peeling apart the donor 10 and receptor 20 reveals a monochrome image 12a on the receptor 20, as depicted in FIG. 4.

In this exemplary technique for generating a digital color image on a substrate, the substrate is digital receptor 20. The process for generating a digital color image on the substrate may be repeated one or more times using donor sheets of different colors to build a multicolor image on a common receptor 20. Digital image 12a may therefore include more than one color.

After peeling the donor sheet 10 from the receptor 20, the digital image 12a residing on the substrate can be cured by subjecting it to heat treatment, preferably at temperatures in excess of about 120° C. This may be carried out by a variety of means, such as storage in an oven, hot air treatment, contact with a heated platen or passage through a heated roller device. In the case of multicolour imaging, where two or more monochrome images are transferred to a common receptor, it is more convenient to delay the curing step until all the separate colorant transfer steps have been completed, then provide a single heat treatment for the composite image. However, if the individual transferred images are particularly soft or easily damaged in their uncured state, then it may be necessary to cure and harden each monochrome image prior to transfer of the next, but in preferred embodiments of the invention, this is not necessary. In the situation that the receptor to which a colorant image is initially transferred is not the final substrate on which the image is viewed, curing and hardening of the image may conveniently be accomplished in the course of the transfer to the second receptor.

Figure 5:
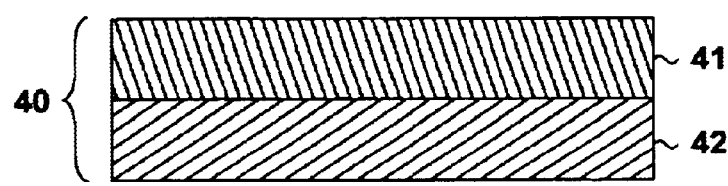
FIG. 5 illustrates an analog receiver element (40) having an analog support element (41) and an analog receiver material (42).

A hybrid imaging method of the present invention includes at least one analog imaging step. Preferably, this is accomplished by providing an analog receiver element 40, shown in FIG. 5, having an analog support element 41 with an analog receiver material 42 coated thereon. Preferably, the analog support element 40 is composed of various film-forming synthetic or high polymers including addition polymers (e.g., poly(vinylidene chloride), poly(vinyl chloride), poly(vinyl acetate), polystyrene, polyisobutylene polymers and copolymers), and linear condensation polymers (e.g., poly(ethylene terephthalate), poly (hexamethylene adipate), and poly(hexamethylene adipamide/adipate)) and plastic sheets and films, such as, polyethylene terephthalate, fluorene polyester polymers, polyethylene, polypropylene, acrylics, polyvinyl chloride and copolymers thereof, and hydrolyzed and non-hydrolyzed cellulose acetate. More preferably, it is a polyester sheet.

Coated on the analog support element 41 is a layer of analog receiver material 42 that is preferably a resin that can be any thermoplastic resin. Examples of thermoplastic resins suitable for the analog receiver material include thermoplastic linear polymers, such as, for example, polyvinyl butyral, polyvinyl formal, polystyrene, polyvinyl chloride, polyvinylidene chloride, polyacrylic esters, polyvinyl acetates, polyesters, polyurethanes and polyamides, polyethylenes, phenoxy resins, copolymers of vinyl acetate and vinyl chloride, copolymers of styrene and isoprene, copolymers of styrene and butadiene, copolymers of styrene and acrylonitrile, terpolymers of vinyl acetate, methyl methacrylate, and butyl methacrylate, terpolymers of N-hydroxymethyl acrylamide, butyl acrylate, and methyl methacrylate. The layer of resin may comprise one or more resins, and may optionally include other additives, such as surfactants, plasticizers, pigments, optical brighteners, coalescence aids, etc. Preferably, the analog receiver material 42 is a material that adheres to the substrate bearing digital image 12*a*. For example, when the digital image 12*a* is formed by laser induced film transfer, as described in detail above, the analog receiver material 42 is preferably a layer of polyester coated on the analog support element 41.

Figure 6:
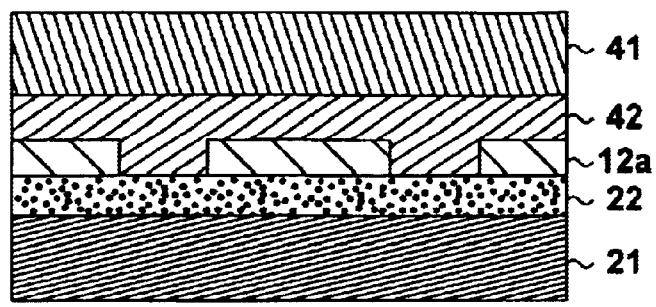
FIG. 6 illustrates the analog receiver material (42) of the analog receiver element (40) in intimate face-to-face contact with the digital image (12a).
Figure 7:
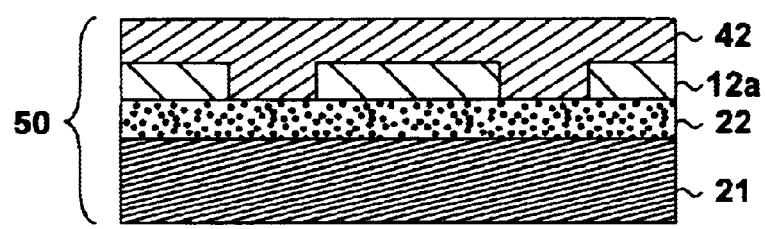
FIG. 7 illustrates the digital/analog imaging element (50) resulting from the removal of the analog support element (41).

The analog receiver element 42 is then laminated on a digitally generated image from above, as shown in FIG. 6, and the analog support element 41 is preferably peeled from the laminated image as shown in FIG. 7, leaving the digitally generated image 12*a* over-coated with the analog receiver material 42.

Figure 8:
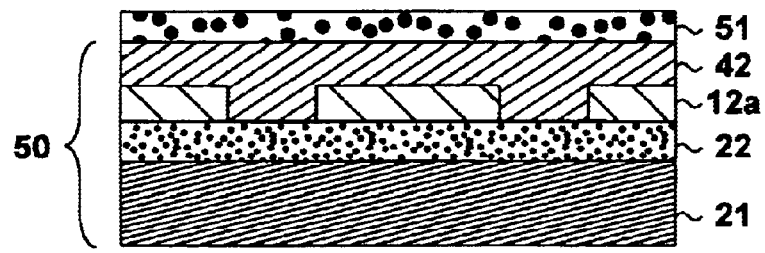
FIG. 8 illustrates the digital/analog imaging element (50) on which is coated a layer of a photopolymerizable composition (51).

Next, as shown in FIG. 8, a photopolymerizable composition 51 is coated on the analog receiver material 42 laminated to the substrate bearing digitally generated image 12*a*. The essential ingredients of the photopolymerizable composition 51 are an oligomer, a binder, a photoinitiation system, and a colorant.

It is preferred to have as the photoinitiator system a photosensitizer and a compound which when photosensitized is capable of initiating free radical polymerization. In the practice of this invention the second compound is defined as an initiator. The photoinitiator system is more preferably present in an amount of 0.5 to 10 parts.

Generally, the photopolymerizable compositions of the invention are prepared by mixing the components in a low boiling (at atmospheric pressure boiling at less than about 150° C.) polar solvent that is not reactive with carboxyl groups or ethylenically unsaturated groups, such as methanol, ethanol, propanol, acetone, methylethyl ketone, tetrahydrofuran or mixtures thereof. There may even be water present although less than 50% by weight of water in the solvent is preferred. The amount of solvent used (generally 0% to 98% by weight, preferably 10% to 96% by weight) depends upon the desired viscosity and desired coating thickness.

Optionally, these photopolymerizable compositions may contain any number of additional useful additives such coating aids, surfactants, etc. For example, it is often desirable to add a surfactant or coating aid, but these aids, including the solvent are not functionally required for practice of the invention, but are merely better modes of practice. Regarding surfactant, it may be present in an amount of 0.001% to 2% and particularly useful surfactants include silicone or fluorocarbon surfactants.

Preferably, the oligomer is a urethane oligomer, as described in U.S. Pat. No. 4,228,232 (Rousseau). Specifically, the oligomer has the formula

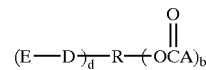

wherein E is an ethylenically unsaturated, free radical polymerizable group, D is the residue of a polyisocyanate having at least two of its isocyanate groups reacted to form

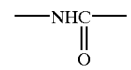

groups bonded to E and R, R is the residue of a polyol having at least a +b hydroxyl groups, the residue formed by removal of hydrogen from the hydroxyl groups, said polyol having a number average molecular weight between 90 and 10,000, A is a carboxylic acid containing group, a is a number having an average value between 2 and 20, and b is a number having an average value between 0.3 and 10. Controlling the ratio of the number of acid (carboxylic acid) groups on the oligomer to the gram molecular weight of the oligomer is an effective way of controlling the bondability of the composition to a substrate after photoinitiated reaction. With increasing acid concentration, the composition is removed more easily in development. A wide range of ratios can be used, depending upon the performance characteristics desired in the final product. A composition having a ratio of molecular weight to acid groups between 67 and 17,000 is useful. It is preferred to have the ratio of molecular weight to acid groups in the oligomer between 500 and 5,000, and most preferably between 800 and 3,000.

The photopolymerizable composition may also include a binder. This material is an organic film forming polymer having a molecular weight of at least 6,000, preferably 12,000 and most preferably at least 15,000. It is desirable, but not essential for practice of the present invention, for the binder to have a labile hydrogen or easily abstractable hydrogen thereon. The polymer preferably has a molecular weight of no greater than 100,000, preferably no greater than 80,000 and most preferably no greater than 50,000, although binders with molecular weights up to 2,000,000 or 3,000,000 are known in the art. To be a labile or easily abstractable hydrogen, a hydrogen in the binder must be attached to a carbon atom having an adjacent heteroatom selected from N, S, Se, and O. Preferably the heteroatom is N, S, or O. It is also preferred that the carbon having the easily abstractable hydrogen thereon is in a 5, 6, or 7-membered heterocyclic ring comprised of C, N, S, and O atoms, with preferably two heteroatoms adjacent to the carbon atom having the labile hydrogen. The carbon atom bearing the labile hydrogen can be primary, but is preferably secondary or tertiary. The greater the ease of abstractability the lower the proportion of binder that the composition needs, although not necessarily in a linear relationship. Preferred binders are the polyvinyl acetals such as polyvinyl formal, polyvinyl butyral, and mixtures thereof, poly(vinyl methylether), polyvinyl alcohol, hydroxyalkylcellulose (e.g., hydroxypropylcellulose), polyamides, polyvinylacetate, polyvinylacetate-polyvinylchloride copolymers, polyethyleneoxides, and polyacrylates (e.g., polyalkylmethacrylates).

A photopolymerizable composition must also have a radiation sensitive system capable of initiating free radical polymerization upon absorption of radiation. Free radical initiators are materials known in the art, such as Free-Radical Chemistry, D.C. Nonhebel and J. C. Walton, University Press (1974). Particularly suitable free radical generators can be selected from many classes of organic compounds including, for example, organic peroxides, azo compounds, aromatic diazonium salts, aromatic iodonium salts, aromatic sulfonium salts, aromatic phosphonium salts, quinones, benzophenones, nitroso compounds, acyl halides, aryl halides, hydrazones, mercapto compounds, pyrylium compounds, triarylimidazoles, biimidazoles, chloroalkyltriazines, etc. These materials, in general, must have photosensitizers therewith to form a photoinitiator system. Photosensitizers are well known in the art.

Additional reference in the art to free radical photoinitiator systems for ethylenically unsaturated compounds are included in U.S. Pat. No. 3,887,450 (e.g., column 4), U.S. Pat. No. 3,895,949 (e.g., column 7), and U.S. Pat. No. 4,043,810. Preferred initiators are the onium salts as disclosed in U.S. Pat Nos. 3,729,313, 4,058,400 and 4,058,401. Other desirable initiators are biimidazoles and chloroalkyltriazines as disclosed in U.S. Pat. No. 3,775,113. These references also disclose sensitizers therein. Another good reference to photoinitiator systems is Light-Sensitive Systems, J. Kosar, 1965, J. Wiley and Sons, Inc. especially Chapter 5.

One type of preferable initiator includes halomethyl-1,3, 5-triazine compounds, more preferably, a chromophore-substituted halomethyl-1,3,5-triazine photopolymerization initiators. As used herein, the phrase "chromophore-substituted" means substituted by a chromophoric moiety conjugated with the triazine ring by ethylenic unsaturation, as described in U.S. Pat. No. 3,987,037.

Preferably, the halomethyl-1,3,5-triazine photopolymerization initiator has one of the general fomulae as described in U.S. Pat. No. 5,484,919 (Bonham). Preferably, the photopolymerizable initiator is a compound of Formula:

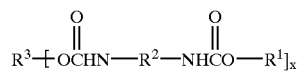

wherein $R^1$ represents a residue of a hydroxyl-substituted, chromophore-substituted, halomethyl-1,3,5-triazine compound, $R^1$—OH; $R^2$ represents a residue from a compound, $R^2$—(NCO)$_2$, having isocynato groups, (NCO), of dissimilar reactivities, i.e., dissimilar rates of reaction; and $R^3$ represents a residue of a hydroxyl-substituted compound, $R^3$—(OH)$_x$, where x represents an integer greater than or equal to 1 (preferably 1 to 10), and more preferably, 2,4-bis(trichloromethyl)-6-[3-(2-hydroxyethoxy)styryl]-1,3,5-triazine, also referred to as meta-MOSTOL (1.1 mole).

A colorant in the photopolymerizable composition useful in the present invention can be essentially any dye or pigment or mixture of dyes and/or pigments of the desired hue may be used so long as it is a dispersible material in the in the photopolymerizable composition. In other words, any colorant that is soluble in the coating solvent and does not adversely affect the light sensitivity of the layer of photopolymerizable composition, inhibit the polymerization reaction, or migrate excessively into adjacent layers, is suitable.

Dispersible materials that enhance color (i.e., color enhancing additives) include, for example, fluorescent, pearlescent, iridescent, and metallic materials. Materials such as silica, polymeric beads, reflective and non-reflective glass beads, or mica may also be used as the dispersible material to provide a textured image. Such materials are typically colorless, although they may be white or have a color that does not detract from the color of the pigment, for example, and can be referred to as texturizing materials. The color enhancing additives or texturing materials may be used either alone or in combination with pigments or dyes to produce proofs with the desired visual effects.

Pigments and crystalline nonsublimable polymeric dyes are preferred because they have a lower tendency for migration between the layers. Pigments are more preferred due to the wide variety of colors available, their lower cost, and their greater correlation to printing inks. Solid-particle pigments typically have a much greater resistance to bleaching or fading on prolonged exposure to sunlight, heat, humidity, etc., in comparison to soluble dyes, and hence can be used to form durable images. The use of pigment dispersions in color proofing materials is well known in the art, and any of the pigments previously used for that purpose may be used in the present invention. Pigments can be selected from the many types that are commercially available for matching color specifications established by the color printing industry. Pigments are more preferred as colorants in photopolymerizable compositions, and, more particularly, in photopolymerizable compositions used in color proofing applications. Pigments or blends of pigments matching the yellow, magenta, cyan, and black references provided by the International Prepress Proofing Association (known as the SWOP color references) are particularly preferred, although the invention is by no means limited to these colors. Pigments of essentially any color may be used, including those conferring special effects such as opalescence, fluorescence, UV absorption, IR absorption, ferromagnetism, etc.

The pigment or combinations of pigments can be dispersed by milling the pigment in the photopolymerizable composition. More preferably, the pigment is dispersed by milling the pigment in a dispersing resin or combination of resins and then added to the photopolymerizable composition.

Preferably, the photopolymerizable composition 51 is coated on an analog receiver material 42 (such as polyester) deposited on the substrate bearing digital color image 12*a* as shown in FIG. 8. The coating weight of the photopolymerizable compositions useful in the present invention is usually 0.3 to 9 g/m$^2$, preferably 0.5 to 5 g/m$^2$, and most preferably 0.8 to 2.4 g/m$^2$.

Figure 9:
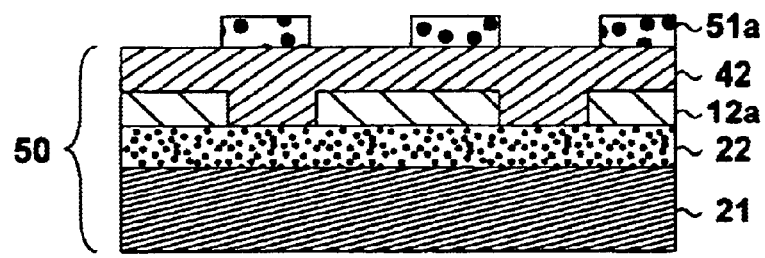
FIG. 9 illustrates the analog receiver material (42), of the digital/analog imaging element (50), having an analog image (51a) resulting from the imagewise exposure and processing of the digital/analog imaging element (50) and the layer of photopolymerizable composition (51).
Figure 10:
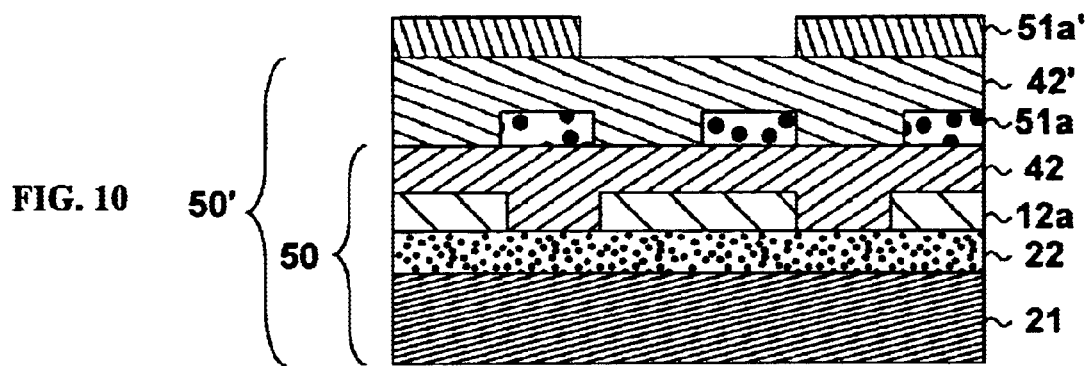
FIG. 10 illustrates the digital/analog imaging element (50), having a second analog image (51a'), resulting from a second analog receiver element, comprising an analog support element and an analog receiver material (42'), in intimate face-to-face contact with the analog image (51a), the removal of the analog support element, the coating of the analog receiver material (42') with a layer of a second photopolymerizable composition, and the imagewise exposure and processing of the digital/analog imaging element (50') and the layer of the second photopolymerizable composition.

The layer of photopolymerizable material 51 is then image-wise exposed to actinic radiation, as is known in the art. The unexposed areas of the colored layer of photopolymerizable material are then dissolved away with a developer solution, thus leaving a colored analog image 51*a* disposed on the digital color image 12*a*, forming a hybrid analog/digital color image as shown in FIG. 9. In this way, the analog image is formed directly on the digitally generated image.

Developer solutions used to develop an analog image after exposure are typically comprised of a combination of sodium or potassium carbonate, and sodium or potassium bicarbonate and a surfactant. For example, the carbonate concentration is in an amount 0.5–2% by weight, the bicarbonate concentration is in the amount 0–1% by weight, and the surfactant concentration is in the amount 0.1–1% by weight of the total developer solution and the balance is water. Some preferred surfactants non-exclusively include the following commercially available surfactants: SURFYNOL 465 (ethoxylated tetramethyl decynediol), from Air Products; SURFACTOL 365 (ethoxylated castor oil), from CasChem; TRITON X-100 (octylphenoxy-polyethoxyethanol) and SURFYNOL GA (acetylenic diols compounded with other non-ionic surfactants and solvents), from Air Products.

Each of these steps can be repeated for a different color, whereby a subsequent analog photopolymerizable composition containing a different color is applied over the previous colored image on the same side of the hybrid digital/analog color image. FIG. 9 illustrates application of an additional analog image to an analog/digital color image. In particular, a second analog receiver element may be deposited on the analog/digital color image and imagewise exposed, generating a hybrid digital/analog imaging element 50' including a second analog image 51 *a*'. The second analog receiver element may be coated with a photopolymerizable composition after assembly with the analog/digital color image. In a variation, the second analog receiver element may be coated with a photopolymerizable composition prior to assembly, as described below.

Figure 11:
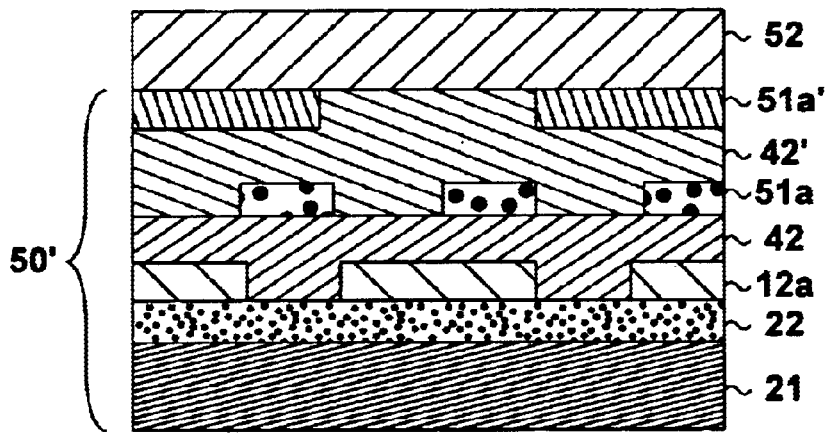
FIG. 11 illustrates a hybrid digital/analog imaging element (50') and a permanent support (52), with the permanent support in face-to-face contact with the second analog image (51a'), resulting from the lamination of the permanent support to the hybrid digital/analog imaging element (50').
Figure 12:
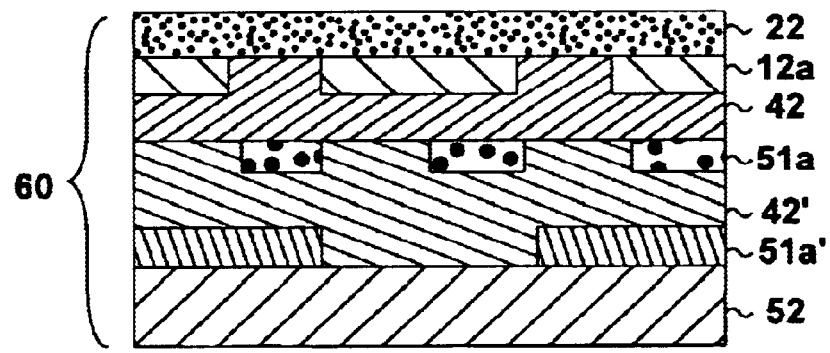
FIG. 12 illustrates a final hybrid digital/analog color proof (60) from the system of the present invention, resulting from the removal of the digital receiver substrate (21) from the receiving layer (22) of the digital receptor element (20).

FIGS. 11 and 12 illustrate a technique for creating a final color proof 60. A permanent support 52 may be brought into face-to-face contact with second analog image 51 *a*'. Upon removal of the digital receiver substrate 21 from the receiving layer 22, the final color proof 60 results. In the example shown in FIG. 12, the final color proof 60 includes a digital image 12*a* with two analog images 51*a* and 51 *a*'.

Figure 13:
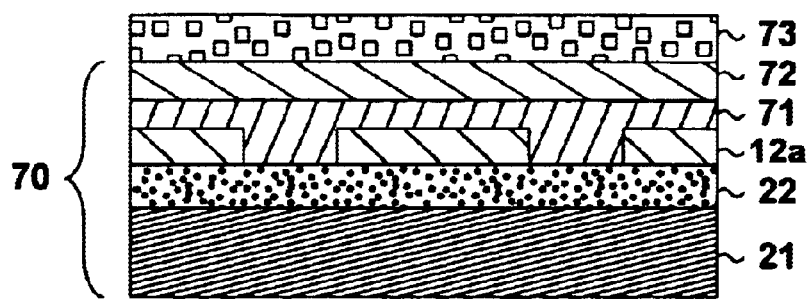
FIG. 13 illustrates a pre-coated analog receiver element (74) having an adhesive layer (71), a layer of photopolymerizable composition (72) and a release layer (73), the pre-coated analog receiver element (74) in intimate face-to-face contact with the digital image (12a).
Figure 14:
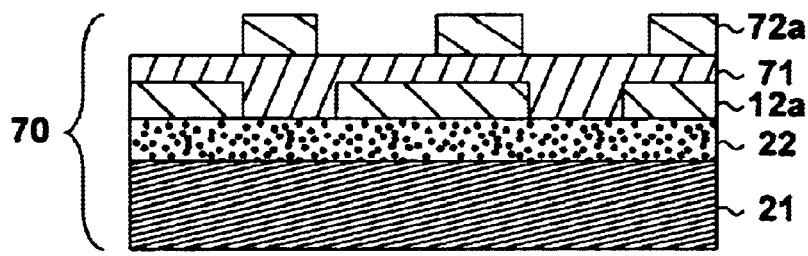
FIG. 14 illustrates the digital/analog imaging element (70) resulting from the removal of the release layer (73).

FIG. 13 illustrates a another application of an analog image to an analog/digital color image. In particular, a pre-coated analog receiver element 74 may be laminated on a substrate bearing digitally generated image 12*a* to generate a hybrid digital/analog imaging element 70. Pre-coated analog receiver element 74 may comprise an adhesive layer 71, a layer of a photopolymerizable composition 72 and a release layer 73. Pre-coated analog receiver element 74 may further comprise a polyester support film (not shown) in contact with release layer 73. Following joining of pre-coated analog receiver element 74 to the substrate bearing digital image 12*a*, the polyester support film may be removed. Imagewise exposure of hybrid digital/analog imaging element 70 generates an analog image 72*a* directly on digitally generated image 12*a*.

An additional analog image may be applied to hybrid digital/analog imaging element 70 using techniques described above. In particular, a second analog receiver element may be assembled with the hybrid digital/analog imaging element 70 and imaged.

Figure 15:
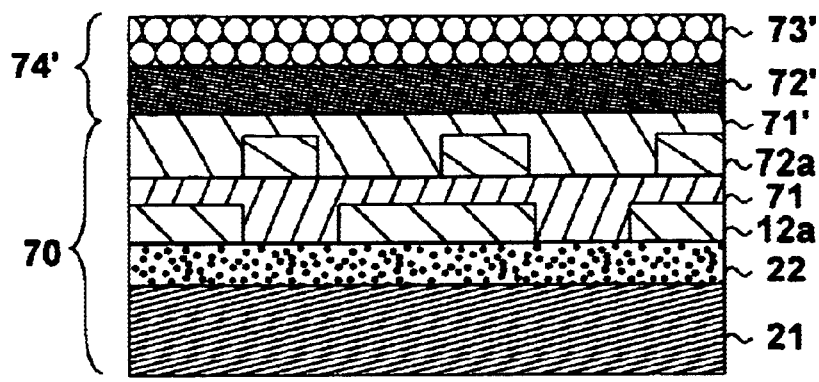
FIG. 15 illustrates the digital/analog imaging element (70) in intimate contact with a second pre-coated analog receiver element (74') having an adhesive layer (71'), a layer of photopolymerizable composition (72') and a release layer (73').
Figure 16:
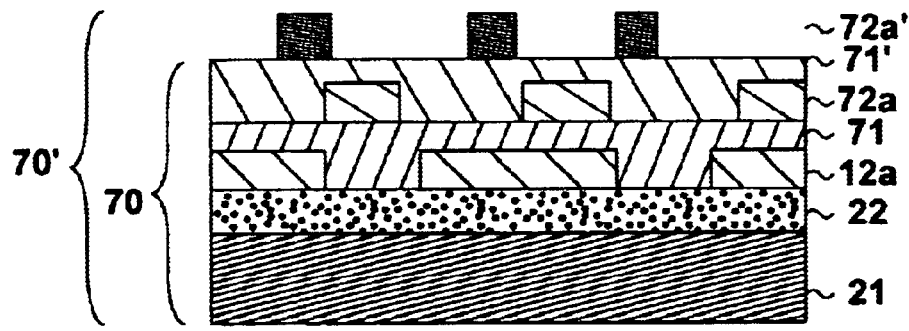
FIG. 16 illustrates a digital/analog imaging element (70'), comprising the digital/analog imaging element (70) and a second analog image (72a'), resulting from the removal of the release layer (73').

FIGS. 15 and 16 illustrate a technique for applying an additional analog image to hybrid digital/analog imaging element 70. A second analog receiver element may be coated with a second photopolymerizable composition following assembly with hybrid digital/analog imaging element 70, or may be pre-coated with the second photopolymerizable composition prior to assembly. In FIG. 15, second analog receiver element 74' is pre-coated. Second analog receiver element 74' may be imagewise exposed, generating a hybrid digital/analog imaging element 70' that includes a second analog image 72*a*'.

Two examples are provided below to illustrate the practice of the invention. The first example pertains to the preparation of a 4 color digital halftone image. A 4-color digital image on receptor was prepared in the following way: Four color donors commercially available from Kodak Polychrome Graphics (Norwalk, Conn.) under the trade designations MATCHPRINT DIGITAL HALFTONE Cyan, Yellow, Magenta and Black donors and release receptors commercially available under the trade designation MATCHPRINT DIGITAL HALFTONE RELEASE RECEPTOR were loaded into the cassette of an imager commercially available under the trade designation CREO SPECTRUM TRENDSETTER from Creo, Vancouver, B.C. A 4-color halftone image in reverse reading was formed on the receptor element. Imaging was done using the following conditions on the imager: black (14 watts, 125 rpm), cyan (16.8 watts, 160 rpm), magenta (14.9 watts, 120 rpm), yellow (17 watts, 170 rpm).

The 4-color digital image on the receptor formed from above was placed on two pieces of a base substrate commercially available under the trade designation MATCHPRINT COMMERCIAL BASE (coating side up). The lead edge of the receptor bearing the image was taped to the base. The receptor-digital image-base "sandwich" was placed in the lower tray of a laminator commercially available under the trade designation MATCHPRINT 447 LAMINATOR. An analog receiver element commercially available under the trade designation MATCHPRINT PLUS RECEIVER was placed in the top tray of the laminator. The analog receiver element was laminated to the digital image-receptor under the following conditions: upper laminator roll=290° F. (143.3° C.), lower laminator roll=170° F. (76.7° C.), throughput=35"/min (88.9 cm/min). The construction was allowed to cool and the analog receiver base was slowly peeled away from the image, leaving the analog receiver coating laminated to the digital image. The digital image with receiver coating was placed on an analog coater commercially available under the trade designation MATCHPRINT PLUS MODEL 3040 COATER. An analog photopolymerizable composition commercially available under the trade designation MATCHPRINT PLUS WARM RED INK was coated and dried on the analog receiver coating using the following conditions: #11 meyer bar, coating speed=38"/min (96.5 cm/min), dry speed=13"/min (33 cm/min), drying temp=~115° F. (46.1° C.). The digital image with the red ink coating was placed in the lower tray of the laminator. The analog receiver base that was removed after lamination of the receiver element to the digital image was placed in the top tray. The construction was "relaminated" as described above. The analog receiver base was peeled away. This "re-lamination" is done to improve the adhesion of the analog photopolymerizable composition to the receiver coating, but is an optional step. To image the analog photopolymerizable composition, a silver halide based film negative (reverse reading) was placed in contact (emulsion side in contact with the red ink layer) with the red coated digital receptor in a vacuum frame. Vacuum was applied to the element for about 30 seconds. The element was exposed to actinic radiation using a 5 kW Olec Model L1261 photopolymer bulb for about 20 seconds. The exposed analog/digital construction was removed and run through an analog developer commercially available under the trade designation KODAK POLYCHROME GRAPHICS MATCHPRINT MODEL 2530 PROCESSOR, using KODAK POLYCHROME GRAPHICS MATCHPRINT PLUS DEVELOPER. Throughput was 60"/min (152.4 cm/min), developer flow rate was 1000 cc/min and developer temperature was 80° F. (26.7° C.).

The resulting 5-color hybrid digital/analog image was laminated to a final substrate commercially available under the trade designation KODAK POLYCHROME GRAPHICS MATCHPRINT DIGITAL HALFTONE COMMERCIAL BASE using a laminator commercially available under the trade designation KODAK POLYCHROME GRAPHICS MODEL 447L LAMINATOR (20"/min; upper roll temp.=275° F. (135° C.); lower roll temp=225° F. (107.2° C.)). After the proof cooled to room temperature, the carrier support was peeled away leaving the 5-color hybrid analog/digital proof on the base.

The second example pertains to a preparation of a 5-color digital halftone image. A 5-color digital image on receptor was prepared in the following way: Five color donors commercially available from Kodak Polychrome Graphics (Norwalk, Conn.) under the trade designations MATCHPRINT DIGITAL HALFTONE Cyan, Yellow, Magenta, Custom Orange and Black donors and release receptor commercially available under the trade designation MATCHPRINT DIGITAL HALFTONE RELEASE RECEPTOR were loaded into the cassette of an imager commercially available under the trade designation CREO SPECTRUM TRENDSETTER from Creo, Vancover, B.C. A 5-color halftone image in reverse reading was formed on the receptor element. Imaging was done using the following conditions on the imager: black (14 watts, 125 rpm), cyan (16.8 watts, 160 rpm), magenta (14.9 watts, 120 rpm), yellow (17 watts, 170 rpm), custom orange (16.5 watts, 120 rpm).

The 5-color digital image on the Receptor formed from the above was mounted on two pieces of base substrate commercially available under the trade designation MATCHPRINT COMMERCIAL BASE (coated side up). The lead edge of the receptor bearing the image was taped to the base. The receptor-digital image-base "sandwich" was placed in the lower tray of a laminator commercially available under the trade designation MATCHPRINT 447 LAMINATOR. An analog color donor commercially available under the trade designation MATCHPRINT NEGATIVE WHITE (the "analog White donor") was placed in the upper tray of the laminator. The analog White donor was laminated to the digital image-receptor under the following conditions: upper laminator roll=290° F. (143.3° C.), lower laminator roll=170° F. (76.7° C.), throughput=50"/min (127 cm/min). The construction was allowed to cool and the analog White base was slowly peeled away from the image, leaving the White coating laminated to the digital image.

To image the analog photopolymerizable composition, a silver halide based film negative (reverse reading) was placed in contact (emulsion side in contact with the White layer) with the digital receptor in a vacuum frame. Vacuum was applied to the element for about 30 seconds. The element was exposed to actinic radiation using a 5 kW Olec Model L1261 photopolymer bulb for about 30 seconds. The exposed analog/digital construction was removed and run through an analog developer commercially available under the trade designation KODAK POLYCHROME GRAPHICS MATCHPRINT MODEL 2530 PROCESSOR, using KODAK POLYCHROME GRAPHICS MATCHPRINT COLOR PROOFING NEGATIVE DEVELOPER. Throughput was 60"/min (152.4 cm/min), developer flow rate was 1000 cc/min and developer temperature was 80° F. (26.7° C.).

The resulting 6-color hybrid digital/analog image was laminated to a final substrate of a 30 lb aluminized paper foil using a laminator commercially available under the trade designation KODAK POLYCHROME GRAPHICS MODEL 447L LAMINATOR (20"/min; upper roll temp.=275° F. (135° C.); lower roll temp=225° F. (107.2° C.)). After the proof cooled to room temperature, the carrier support was peeled away leaving the 6-color hybrid analog/digital proof on the base.

The foregoing detailed description and examples have been given for clarity of understanding only. No unnecessary limitations are to be understood therefrom. The invention is not limited to the details shown and described, for variations obvious to one skilled in the art will be included within the invention defined by the claims.

What is claimed is:

1. A method comprising:

digitally generating a color image on a substrate;

assembling an analog receiver material in intimate contact with the substrate;

coating a photopolymerizable analog color material on the analog receiver material;

imagewise exposing the photopolymerizable analog color material to radiation; and processing the exposed photopolymerizable analog color material to form a hybrid digital/analog image.

2. The method of claim 1 wherein digitally generating a color image comprises a technique selected from the group consisting of inkjet, thermography, electrophotography, electrography, laser induced transfer, and a combination thereof.

3. The method of claim 2 wherein laser induced transfer comprises a transfer method selected from the group consisting of dye sublimation, ablation, malt transfer, and film transfer.

4. The method of claim 1 wherein digitally generating a color image comprises:

assembling a digital donor element comprising a colorant in intimate contact with a digital receiver element;

exposing the assembly to radiation to transfer at least a portion of the colorant from the digital donor element to the digital receiver element; and separating the digital donor element from the digital receiver element.

5. The method of claim 4 wherein the steps of assembling, exposing and separating from a cycle that is repeated at least once, wherein a different donor element comprising a different colorant is used in each repetition of the cycle but the same digital receiver element is used in each repetition of the cycle.

6. The method of claim 1 further comprising coupling the hybrid digital/analog image to a final receptor and removing a digital receiver element from the digitally generated color image to form a hybrid digital/analog color proof.

7. The method of claim 1, wherein the analog receiver material is a first analog receiver material and the photopolymerizable analog color material is a first photopolymerizable analog color material, the method further comprising assembling a second analog receiver material in intimate contact with the hybrid digital/analog image.

8. The method of claim 7 further comprising coating a second photopolymerizable analog color material on the second analog receiver material;

imagewise exposing the second photopolymerizable analog color material; and processing the exposed second photopolymerizable analog color material to form a second hybrid digital/analog color image.

9. The method of claim 7, wherein the second analog receiver material is coated with a second photopolymerizable analog color material prior to assembly of the second analog receiver material and the hybrid digital/analog image, the method further comprising:

imagewise exposing the second photopolymerizable analog color material; and processing the exposed second photopolymerizable analog color material to form a second hybrid digital/analog color image.

10. The method of claim 1, wherein assembling the analog receiver material in intimate contact with the digital color image comprises laminating the analog receiver material to the digital color image.

11. The method of claim 1, wherein processing the exposed photopolymerizable analog color material comprises eliminating unexposed areas of the photopolymerizable analog color material.

12. A method comprising:

digitally generating a color image on a substrate;

assembling an analog receiver material in intimate contact with the substrate, the analog receiver material being coated with a photopolymerizable analog color material prior to assembly;

imagewise exposing the photopolymerizable analog color material to radiation; and processing the exposed photopolymerizable analog color material to form a hybrid digital/analog image.

13. The method of claim 12, wherein digitally generating a color image comprises a technique selected from the group consisting of inkjet, thermography, electrophotography, electrography, laser induced transfer, and a combination thereof.

14. The method of claim 13, wherein laser induced transfer comprises a transfer method selected from the group consisting of dye sublimation, ablation, melt transfer and film transfer.

15. The method of claim 12, wherein digitally generating a color image comprises:

assembling a digital donor element comprising a colorant in intimate contact with a digital receiver element;

exposing the assembly to radiation to transfer at least a portion of the colorant from the digital donor element to the digits receiver element; and separating the digital donor element from the digital receiver element.

16. The method of claim 15, wherein the steps of assembling, exposing and separating form a cycle that is repeated at least once, wherein a different donor element comprising a different colorant is used in each repetition of the cycle but the sane digital receiver element is used in each repetition of the cycle.

17. The method of claim 12, thither comprising coupling the hybrid digital/analog image to a final receptor and removing a digital receiver element from the digitally generated color image to form a hybrid digital/analog color proof.

18. The method of claim 12, wherein the analog receiver material is a first analog receiver material and the photopolymerizable analog color material is a first photopolymerizable analog color material, the method further comprising assembling a second analog receiver material in intimate contact with the hybrid digital/analog image.

19. The method of claim 18 further comprising:

coating a second photopolymerizable analog color material on the second analog receiver material;

imagewise exposing the second photopolymerizable analog color material; and processing the exposed second photopolymerizable analog color material to form a second hybrid digital/analog color image.

20. The method of claim 18, wherein the second analog receiver material is coated with a second photopolymerizable analog color material prior to assembly of the second analog receiver material and the hybrid digital/analog image, the method further comprising:

imagewise exposing the second photopolymerizable analog color material; and processing the exposed second photopolymerizable analog color material to form a second hybrid digital/analog color image.

21. The method of claim 12, wherein assembling the analog receiver material in intimate contact with the digital color image comprises laminating the analog receiver material to the digital color image.

22. The method of claim 12, wherein processing the exposed photopolymerizable analog color material comprises eliminating unexposed areas of the photopolymerizable analog color material.

* * * * *